(12) United States Patent
Mehregany et al.

(10) Patent No.: US 6,171,972 B1
(45) Date of Patent: *Jan. 9, 2001

(54) FRACTURE-RESISTANT MICROMACHINED DEVICES

(75) Inventors: Mehran Mehregany, Pepper Pike; Christopher A. Bang, North Royalton; Kevin C. Stark, Richmond Heights, all of OH (US)

(73) Assignee: Rosemount Aerospace Inc., Burnsville, MN (US)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/191,966

(22) Filed: Nov. 13, 1998

Related U.S. Application Data (60) Provisional application No. 60/078,295, filed on Mar. 17, 1998.

(51) Int. Cl.$^7$ .................................................. H01L 21/00
(52) U.S. Cl. ................... 438/719; 216/2; 438/735
(58) Field of Search ................... 438/710, 719, 438/735, 753; 216/2, 67, 79

(56) References Cited

U.S. PATENT DOCUMENTS

| | | | |
|---|---|---|---|
| 4,604,162 | 8/1986 | Sobczak | 156/657 |
| 4,774,530 | 9/1988 | Hawkins | 346/140 |
| 5,236,118 | 8/1993 | Bower et al. | 228/193 |
| 5,366,587 | 11/1994 | Ueda et al. | 156/651 |
| 5,403,665 | 4/1995 | Alley et al. | 428/447 |
| 5,435,884 | 7/1995 | Simmons et al. | 216/100 |
| 5,438,870 | 8/1995 | Zabler et al. | 73/504.02 |
| 5,441,803 | 8/1995 | Meissner | 428/220 |
| 5,587,343 * | 12/1996 | Kano et al. | 216/2 X |
| 5,600,071 | 2/1997 | Sooriakumar et al. | 73/721 |
| 5,629,577 | 5/1997 | Polla et al. | 310/328 |
| 5,631,514 | 5/1997 | Garcia et al. | 310/309 |
| 5,649,423 | 7/1997 | Sniegowski | 60/531 |
| 5,658,710 | 8/1997 | Neukermans | 430/320 |
| 5,661,316 | 8/1997 | Kish, Jr. et al. | 257/190 |
| 5,690,763 | 11/1997 | Ashmead et al. | 156/60 |
| 5,804,084 * | 9/1998 | Nasby et al. | 216/88 X |
| 5,869,399 * | 2/1999 | Tu et al. | 438/753 X |
| 5,981,400 * | 11/1999 | Lo | 438/745 |

OTHER PUBLICATIONS

Bhardwaj, J. et al., "Dry Silicon Etching for MEMS," Surface Technology Systems Limited, Prince of Wales Industrial Estate, Abercarn, Gwent, UK, date unknown.

Pan, Jeffrey, Y. et al., "Latched Valve Manifolds for Efficient Control of Pneumatically Actuated Valve Arrays," Transducers '97, 1997 International Conference on Solid–State Sensors and Actuators, Chicago, Jun. 16–19, 1997.

(List continued on next page.)

*Primary Examiner*—William Powell
(74) *Attorney, Agent, or Firm*—Thompson Hine & Flory LLP (57) ABSTRACT

A method for forming micromachined devices out of a polycrystalline silicon substrate using deep reactive ion etching to form the micromachined device. The method comprises the steps of providing a bulk material substrate of polycrystalline silicon, and etching the bulk material using deep reactive ion etching to form the micromachined device. The present invention also includes a method for forming a micromachined device comprising the steps of providing a first layer of single crystal silicon and etching a first set of elements on the first layer. The method further includes the steps of providing a second layer of single crystal silicon, etching a second set of elements on the second layer, and joining the first and second layers together such that the crystal planes of the first layer and the second layer are misaligned and such that the first set and the second set of elements are properly aligned.

35 Claims, 7 Drawing Sheets

OTHER PUBLICATIONS

Micromachined Silicon Fuel Atomizers for Gas Turbine Engines–Proceedings IEEE MEMS 1996 San Diego, CA Feb. 11–15, 1996.

Silicon Bulk Micromachined Accelerometer with Simultaneous Linear and Angular Sensitivity—1997 International Conference on Solid State Sensors and Actuators, Chicago, Jun. 16–19, 1997.

Jun–Hwan Sim, Sung–Ho Hahm, Jung–Hee Lee, Jong–Hyan Lee, In–Sik Yu and Ji–Sup Kim, Eight–Beam Piezoresistive Accelerometer Fabricated By Using A Selective Porous Silicon Etching Method, 1997.

Ernst Lüder, Polycrystalline Silicon–Based Sensors, 1986.

Lucas NovaSensor, Single Crystal Silicon Actuators and Sensors Based on Silicon Fusion Bonding Technology, 1995.

Jeffrey Y. Pan, Ph.D., Donald Verlee and Mehran Mehregany, Ph.D., Latched Valve Manifolds for Efficient Control of Pneumatically Actuated Valve Arrays, 1997.

N. Rajan, C. Zorman, M. Mehregany, R. DeAnna, and R. Harvey, 3C–SiC Coating of Silicon Micromachined Atomizers, 1997.

B.P. van Drieënhuizen, N. I. Maluf, I.E. Opris and G.T.A. Kovacs, Force–Balanced Accelerometer with mG Resolution Fabricated using Silicon Fusion Bonding and Deep Reactive Ion Etching, 1997.

Kurt E. Peterson, Silicon as a Mechanical Material, 1982.

Rajan, N. et al., "Fabrication and Testing of Micromachined Silicon Carbide and Nickel Fuel Atomizers for Gas Turbine Engines." Solid–Stata Senor and Actuator Workshop, Hilton Head Island, South Carolina, Jun. 8–11, 1998, pp. 31–34.

* cited by examiner

FRACTURE-RESISTANT MICROMACHINED DEVICES

This application claims priority to U.S. provisional application Ser. No. 60/078,295, filed Mar. 17, 1998.

This invention was made with Government support under Contract No. N66001-97-c-8614 awarded by DARPA. The Government has certain rights in this invention.

The present invention is directed to micromachined devices and methods for making micromachined devices, and more particularly, to methods for forming micromachined devices from a polycrystalline silicon substrate, as well as micromachined devices formed by such methods.

BACKGROUND OF THE INVENTION

Micromachined devices are typically formed by either bulk micromachining techniques or surface micromachining techniques. When using bulk micromachining, a single-crystal silicon substrate is used to create one or more components, and the components are joined to form a micromachined device. Each component typically has a thickness in the range of several hundred microns, and may have lateral dimensions ranging from tens of microns up to several millimeters. The micromachined device components may be formed by etching a single crystal silicon substrate wafer, using either wet etching (such as anisotropic etching) or dry etching (such as reactive ion etching, or "RIE") to form the features. However, micromachined devices formed of a substrate of single crystal silicon have an inherent propensity to fracture due to the aligned crystal structure of the substrate material. Single crystal silicon tends to fracture relatively easily, and the fractures propagate along the planes of the crystal structure. As a result, the prior art bulk micromachined structures are prone to fracturing and cleaving during assembly or operation of the micromachined device.

Accordingly, there is a need for a method for forming bulk micromachined components of a material having improved fracture-resistant qualities. There is also a need for a method for forming micromachined device components out of single crystal silicon substrates, wherein the resultant micromachined device structure has improved fracture-resistant qualities.

The present invention is a method for forming micromachined devices from a polycrystalline silicon substrate using deep reactive ion etching to form the micromachined device. The resultant micromachined device structure is formed entirely of polycrystalline silicon, thereby offering superior fracture resistance. Polycrystalline silicon does not have the aligned crystal planes of single-crystal silicon, and thus the resultant micromachined device is not as susceptible to fracture.

Relatively recently, deep reactive ion etching (DRIE) has been increasingly used with single crystal silicon substrates to form micromachined devices. DRIE offers highly directional etching, and is not crystal plane dependent. Applicants' invention recognizes the benefits of combining DRIE with the use of a polysilicon substrate to form micromachined devices formed out of a bulk polysilicon substrate.

DRIE may be used with a single crystal silicon substrate having a polysilicon top layer deposited upon the surface of the silicon substrate, as discussed, for example, in U.S. Pat. No. 5,438,870. In such use, the polysilicon top layer typically ranges in thickness from a few microns up to tens of microns, and is deposited upon a single crystal silicon substrate. A layer of silicon dioxide may be grown or deposited on the substrate before the polysilicon surface layer is deposited thereon. Surface micromachining is then used to etch the substrate. In surface micromachining, the etching techniques require and use the differing layers within the substrate to achieve the desired results. For example, as mentioned above a substrate may be formed having a layer of polysilicon on top of a layer of silicon dioxide, which is in turn on top of a single crystal silicon wafer. Surface micromachining etching techniques may then be used to etch the substrate, and these techniques typically rely upon the chemical properties of each of the differing layers to aid in the etching. For example, one step in the etching process may consist of placing the substrate in a solution that dissolves silicon dioxide, but does not dissolve the layers of single-crystal silicon or polysilicon.

This is to be contrasted with bulk micromachining, which is a separate and distinct technology. In bulk micromachining components are formed by deep etching into the body of the wafer, and the etching does not rely upon differing layers in the substrate. Instead, the desired shape is formed directly in the substrate wafer. Bulk micromachining also requires differing etching tools and techniques because the depth of the subject material differs by at least an order of magnitude than that used in surface micromachining. Atomizers, pressure sensors, accelerometers, rate sensors and ink jet printheads are all examples of devices that can be formed by bulk micromachining.

In another embodiment of the invention, two or more layers of single-crystal silicon are joined together such that their crystal planes are misaligned, and the resultant composite is used as a substrate for forming micromachined devices. In the prior art, when substrates have one or more layers of single crystal silicon, the substrate layers typically are arranged such that their crystal structures are aligned. Silicon wafers typically have a feature, such as a flat, formed in the wafer which identifies the crystal orientation of the wafer. During manufacturing, the flats of stacked wafers are aligned for ease of processing the stacked wafers. However, the resultant structure is susceptible to fracture, as the aligned crystal planes allow a fracture to propagate through the entire micromachine structure. The present invention utilizes misaligned crystal layers to inhibit fracture propagation through the micromachined device.

SUMMARY OF THE INVENTION

Accordingly, the present invention is a method for forming a micromachined device comprising the steps of providing a bulk material substrate of polycrystalline silicon, and etching the bulk material using deep reactive ion etching to form the micromachined device. The method of the present invention may also be practiced with amorphous silicon to achieve comparable results. Accordingly, it is to be understood that for the purposes of this application and all of the appended claims, the terms "polycrystalline silicon", as well as "polysilicon", are both to be construed as also including amorphous silicon.

In one embodiment, the present invention is practiced by forming an atomizer which may be used to atomize fluid for combustion. The atomizer discussed herein is merely one of many embodiments in which the present invention may be used, and it is expected that the method of the present invention may be used to form nearly any desired bulk micromachined device and/or bulk micromachined device component.

In another embodiment, the present invention is a method for forming a micromachined device comprising the steps of providing a composite silicon bulk substrate, the substrate including a first section and a second section of single-crystal silicon joined together such the crystal plane structure of the first section is misaligned with the crystal plane structure of the second section. The method further includes the step of etching the composite substrate to form the device.

Other features and advantages of the present invention will be apparent from the following description, with reference to the accompanying drawings and claims, which form a part of the specification.

DETAILED DESCRIPTION

As shown in FIGS. 1–4, the present invention is a micromachined device 10 formed of a bulk material substrate 12 of polycrystalline silicon or amorphous silicon. The substrate 12 has a top surface 14 and a bottom surface 16, and preferably has a thickness of between 100 to 1000 microns. The substrate 12 is etched using deep reactive ion etching to form the micromachined device 10, and in the illustrated embodiment the micromachined device 10 is a fluid atomizer. Such an atomizer is described in U.S. Pat. No. 5,435,884, hereby incorporated by reference. Nearly any micromachined device that can be formed by bulk micromachining may be formed using the method of the present invention, including, but not limited to, atomizers, pressure sensors, accelerometers, rate sensors and ink jet printheads.

Atomizers may be formed by etching a generally circular spin chamber 18 in the substrate 12. The spin chamber 18 is shaped to guide liquid in a vortex motion toward the center of the chamber. An annulus 20 generally encircling the spin chamber 18 is also formed in the substrate 12, and the substrate includes one or more channels 22 connecting the annulus to the spin chamber. The channels preferably extend generally chord-wise. Although the illustrated embodiment has four channels, any suitable number of channels may be used to guide the liquid into the spin chamber. An orifice 24 is formed in the spin chamber 18. The orifice is preferably formed in the center of the chamber 18 by etching through the bottom surface 16 of the bulk material 12. The features of the micromachined device may be formed in any order without departing from the scope of the present invention. It may be preferable, however, to form the orifice on the bottom surface 16 after the features on the top surface 14 have been formed.

Figure 1:
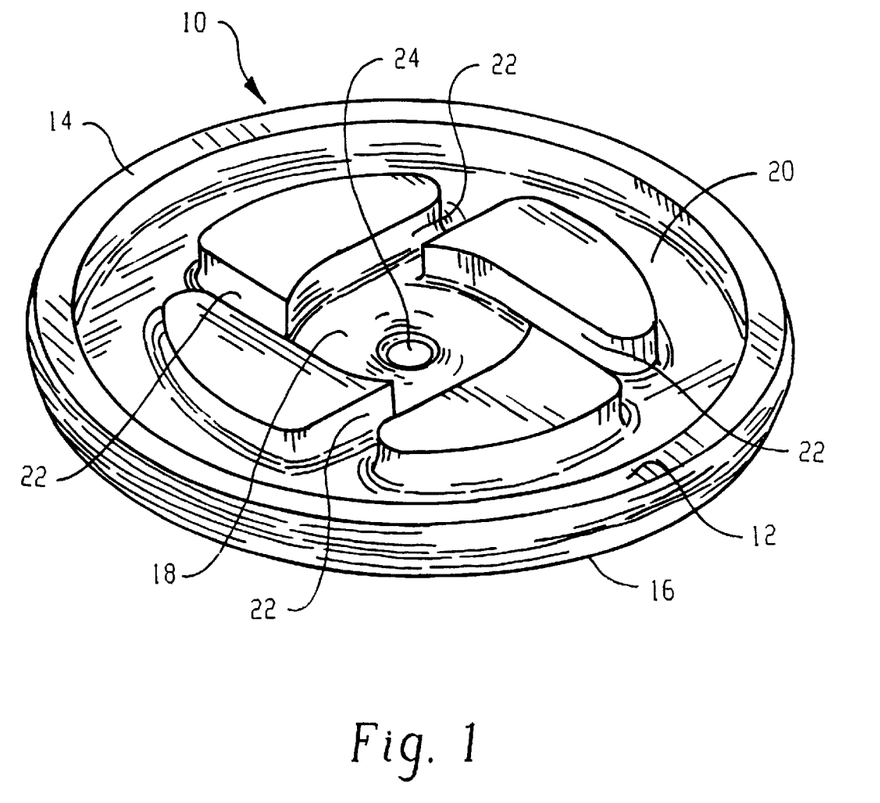
FIG. 1 is a perspective view of an atomizer formed by the method of the present invention.
Figure 2:
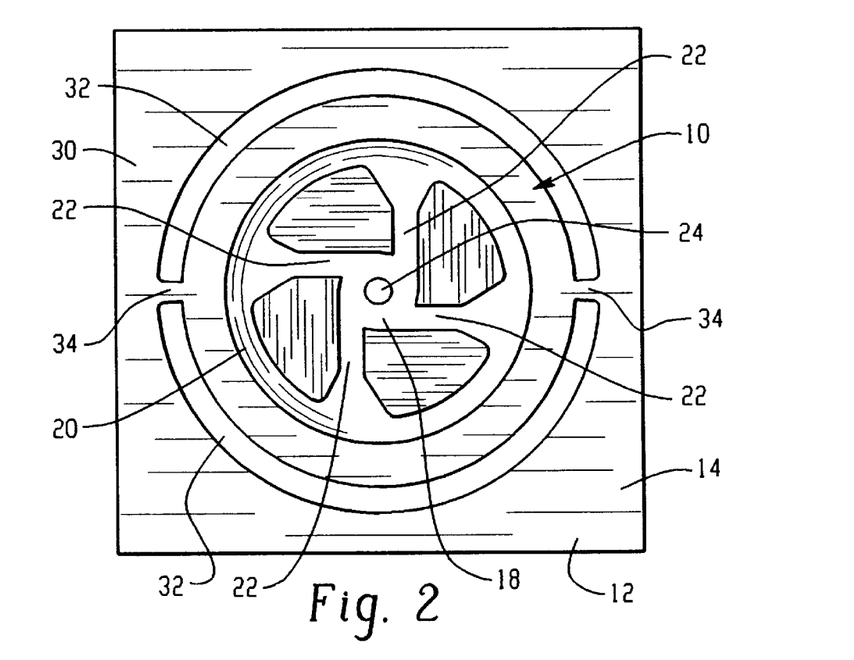
FIG. 2 is a top view of the atomizer of FIG. 1, shown attached to a portion of a wafer.
Figure 3:
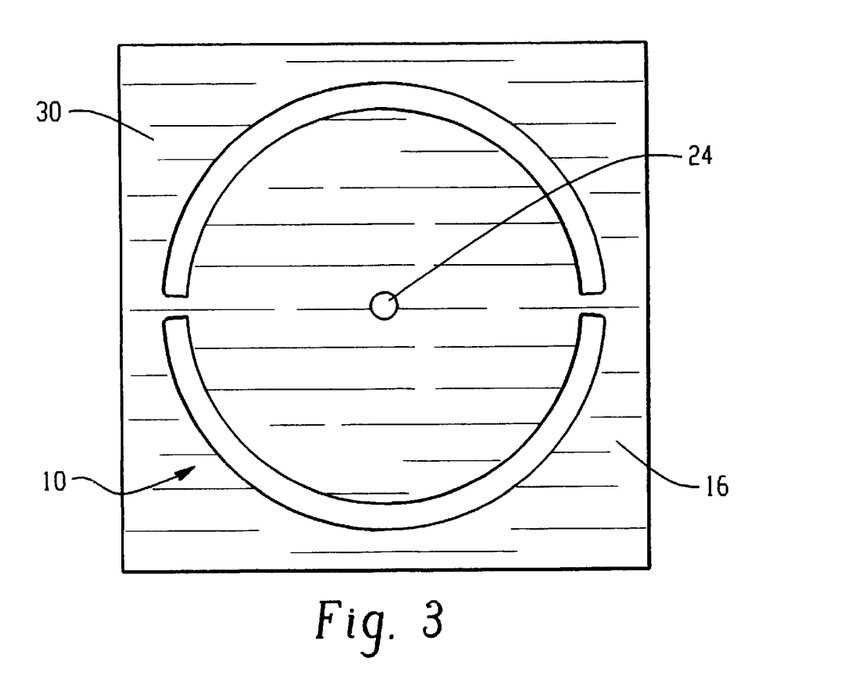
FIG. 3 is a bottom view of the atomizer and wafer portion of FIG. 2.
Figure 4:
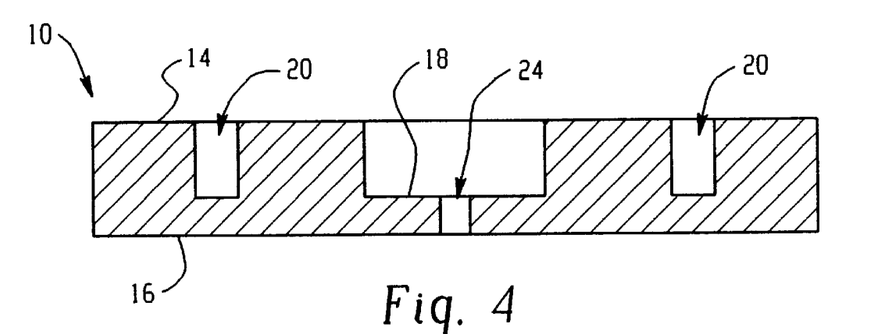
FIG. 4 is a side cross-sectional view of the atomizer of FIG. 1.
Figure 12A:
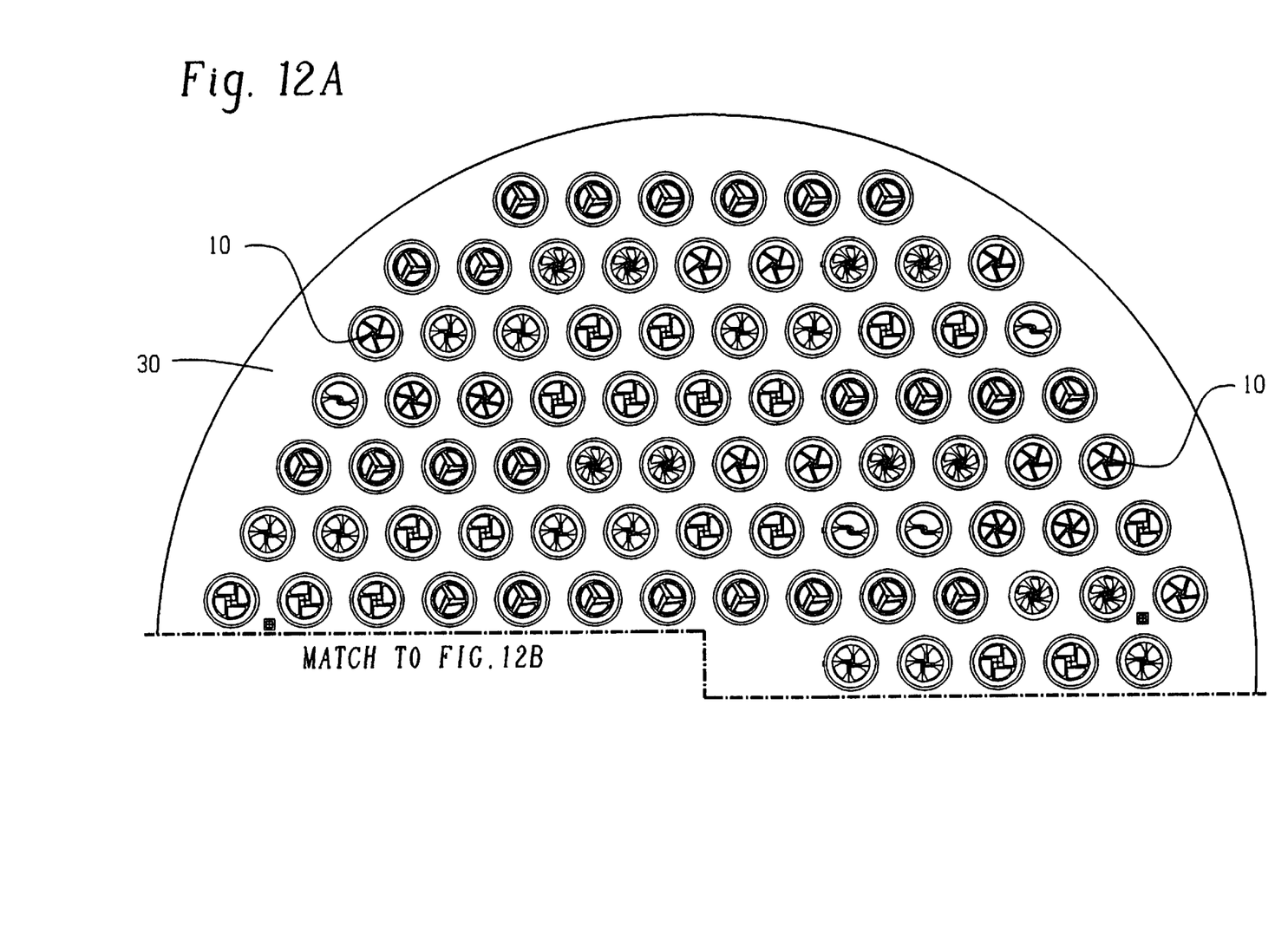
FIGS. 12A and 12B are top views of a wafer having a plurality of micromachined devices formed thereon.
Figure 12B:
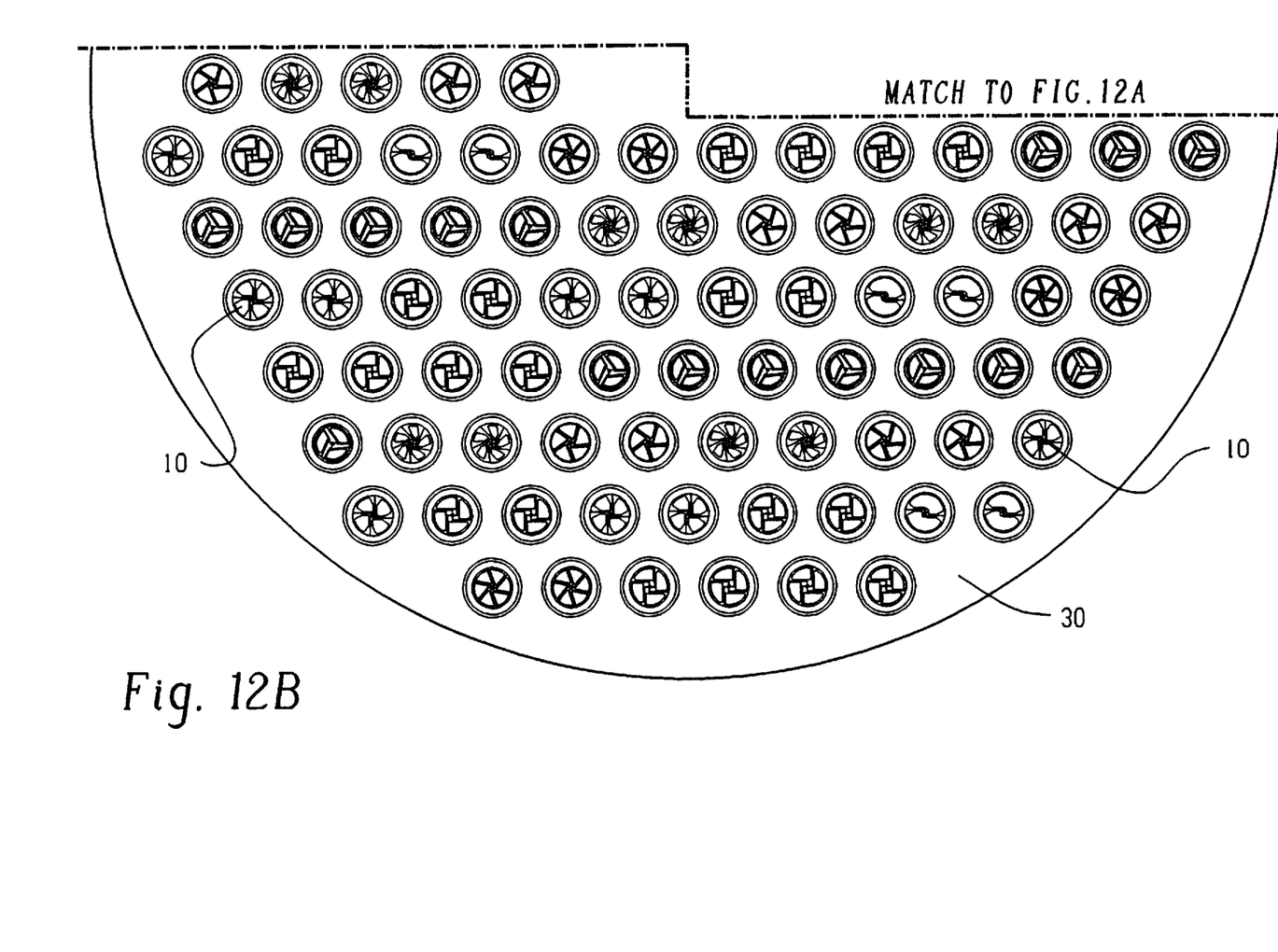

Micromachined devices are generally formed out of a wafer 30 from which numerous micromachined devices 10 may be formed, as illustrated in FIG. 12. As shown in FIGS. 2–3, when the atomizer or micromachined device is first formed, it remains attached to the wafer 30. Two circumferential slots 32 may be cut in the wafer surface 30 to generally separate the atomizer 10 from the wafer surface 30, and a pair of tabs 34 keep the atomizer 10 attached to the wafer surface. The atomizer may be detached by breaking away the tabs 34. Of course, various arrangements of slots 32 and tabs 34 may be utilized. Furthermore, other techniques, such as wafer dicing, may be used to separate the atomizer from the wafer.

Figure 5:
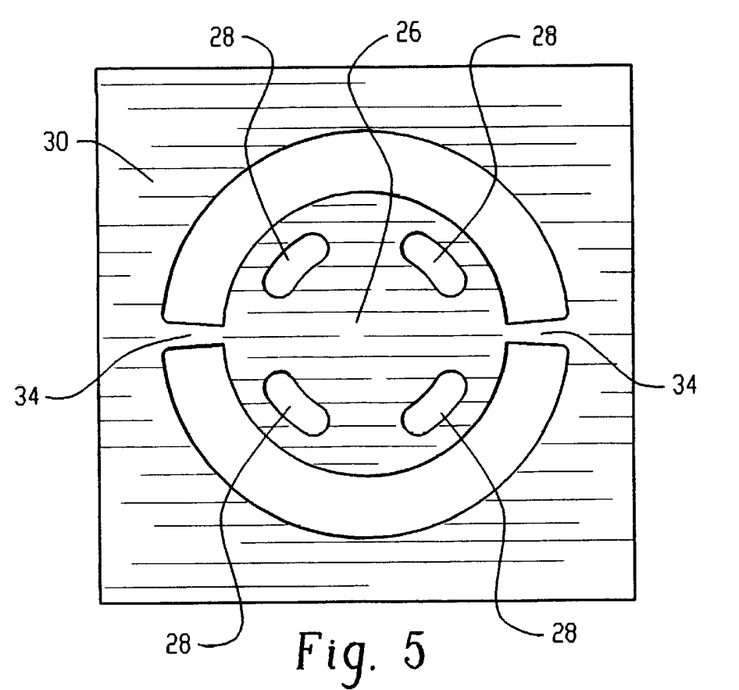
FIG. 5 is a top view of an inlet plate attached to a portion of a wafer.

In operation, fluid enters the atomizer 10 at the annulus 20 and is guided into the spin chamber 18 by the channels 22. After the fluid flows around the spin chamber 18 in a vortex motion, it exits through the orifice 24 in a hollow, conical spray. The atomizer 10 may also have a inlet plate 26 (FIG. 5) bonded to the top surface 14 of the atomizer to seal the top surface and to route the fluid into the annulus 20 in a controlled manner. The inlet plate 26 has one or more apertures 28 formed therein that are aligned with the annulus 20. In this manner, fluid impinging upon the inlet plate 26 is routed to the annulus of the atomizer 10. Various numbers of apertures 28 may be used on the inlet plate, and the apertures may have a variety of shapes. The inlet plate 26 is preferably made of polycrystalline silicon, and as shown in FIG. 5 may also be manufactured from a wafer 30 and attached to the wafer 30 by two or more tabs 34, as discussed above, or may be separated by wafer dicing. In one embodiment, the inlet plate is attached to the wafer by anodic bonding.

In another embodiment of the invention, two or more discreet layers of single-crystal silicon are joined together such that the crystal plane of the first layer is misaligned with the crystal plane of the second layer. Once the first layer and the second layer are joined to form the composite silicon substrate, the substrate may be used as a bulk material from which various micromachined devices may be formed. In this manner, fractures formed in one of the layers are halted in their propagation at the junction between the two layers, and the resultant micromachined device resists fracturing through the entire structure. The composite wafer is less prone to fracture along a crystal plane, due to the fact that propagation of a fracture would necessarily be contrary to the crystal plane of one or more of the wafers. By way of example, the atomizer discussed above may be formed from such a composite substrate, but many other micromachined structures are possible and the scope of the present invention includes all micromachined device structures which may be formed using the misaligned composite substrate as a bulk material. In particular, both surface and bulk micromachining techniques may be used to form micromachined devices in the composite substrate.

Figure 6:
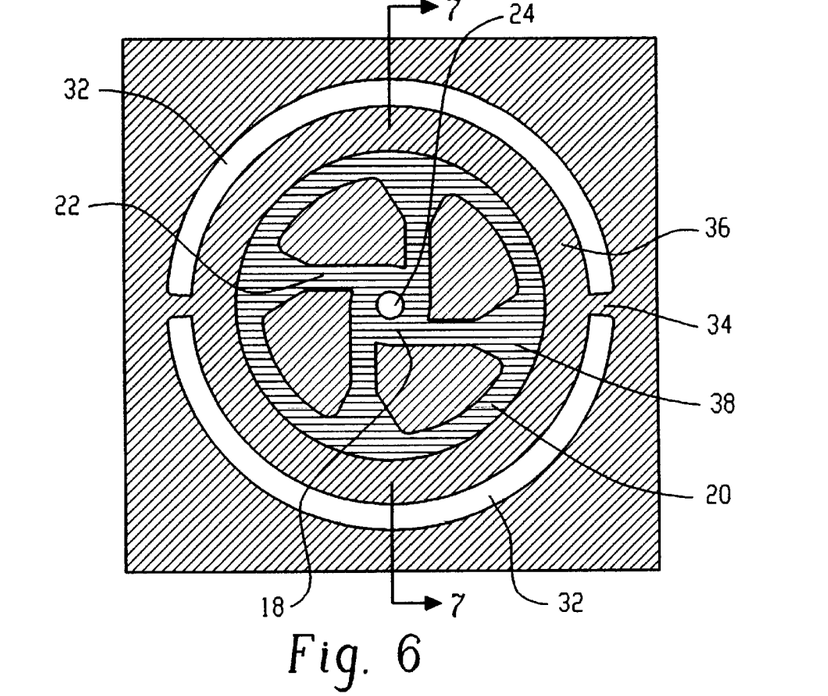
FIG. 6 is a top view of an atomizer formed in accordance with the method of the present invention, with the shading representing differing layers of crystal alignment or structure, the atomizer shown attached to a portion of a wafer.
Figure 7:
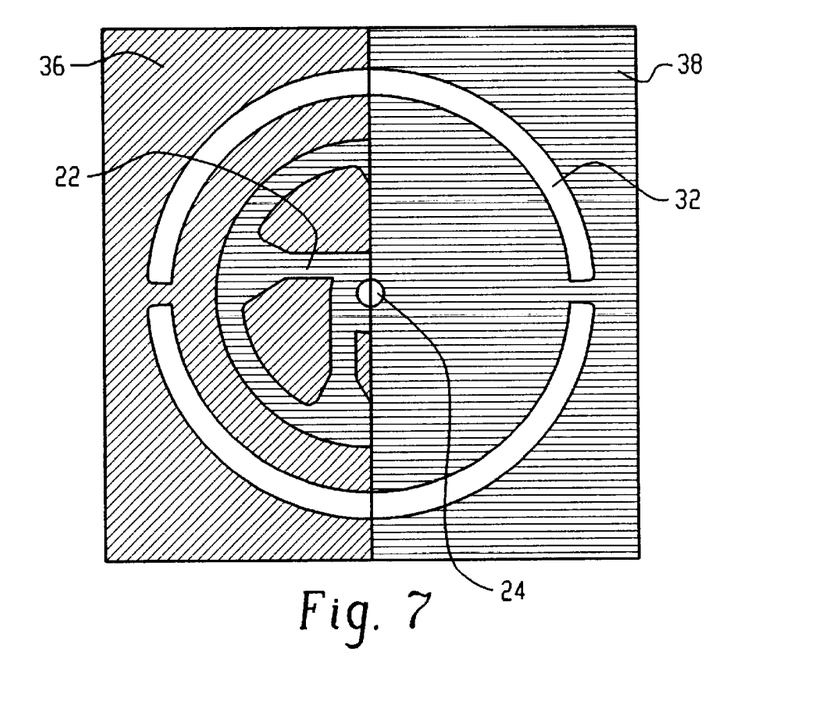
FIG. 7 is a partial cut-away view of the atomizer and wafer of FIG. 6, with the cut-away taken along line 7—7 of FIG. 6.
Figure 8:
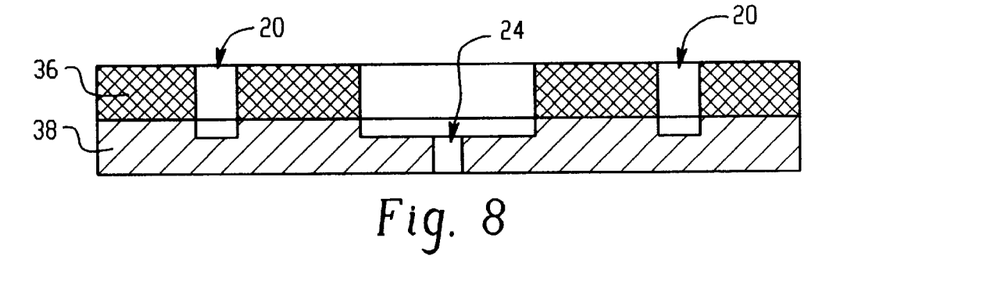
FIG. 8 is a cross-sectional view of an atomizer having a misaligned crystal structure, with the shading representing differing layers of crystal alignment or structure.

As shown in FIGS. 6–8, the atomizer structure may be made of a composite substrate having a first layer 36 misaligned with a second layer 38 such that the substrate inhibits fracture propagation. It should be appreciated that in FIG. 6, as well as in all FIGS. 6–11, each type of shading represents material having a generally consistent crystal plane alignment therein, and areas having differing shading have generally differing crystal plane alignments. Furthermore, the differing shading may also represent differing types of materials. FIG. 6 shows a top view of the atomizer 10, and FIG. 7 illustrates the atomizer embodiment of FIG. 6 with the right half of the first layer 36 removed.

Figure 9:
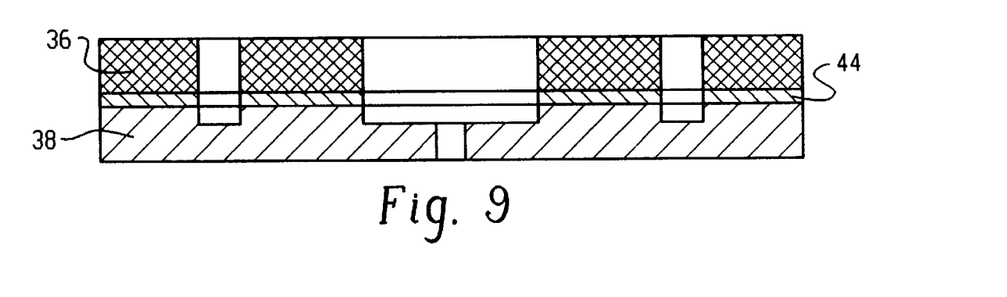
FIG. 9 is a cross-sectional view of the atomizer of FIG. 8 including a thin film layer, the shading representing differing layers of crystal alignment or structure.

It may be desired to grow or deposit a thin film layer 44 between the first layer 36 and the second layer 38, as shown in FIG. 9. The thin film layer 44 may be used to electrically isolate the layers 36, 38 if it is so desired, and the layer 44 may also facilitate bonding between the layers. The thin film is preferably silicon dioxide, and may be grown or deposited on one or more of the layers 36, 38 before they are bonded. The thin film may also be used as an etch stop layer for precise control of etch depth, or as a sacrificial release layer. In a preferred embodiment of the composite substrate, the crystal planes of the first layer 36 are misaligned approximately 45° with the crystal planes of the second layer 38. Further preferably, the first layer and the second layer each have a thickness of about 400 microns (preferably between about 200 and 500 microns), and the first layer and second layers are fusion bonded. Typically a patterned photo-resist etch mask is formed on both sides of the substrate to guide the etching.

The present invention also includes a hybrid substrate having a first section of polycrystalline silicon joined to a second section of single-crystal silicon. The hybrid substrate may then be used as a substrate for bulk or surface micromachining a device therein. The resultant micromachined device resists fractures therethrough due to the fracture-resistant nature of the polycrystalline silicon.

Figure 10:
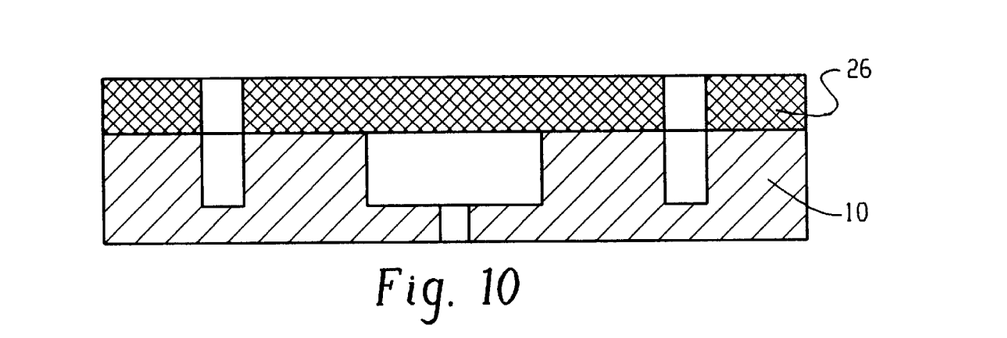
FIG. 10 is a cross-sectional view of an inlet plate and atomizer formed in accordance with the method of the present invention, with the shading representing differing layers of crystal alignment or structure.
Figure 11:
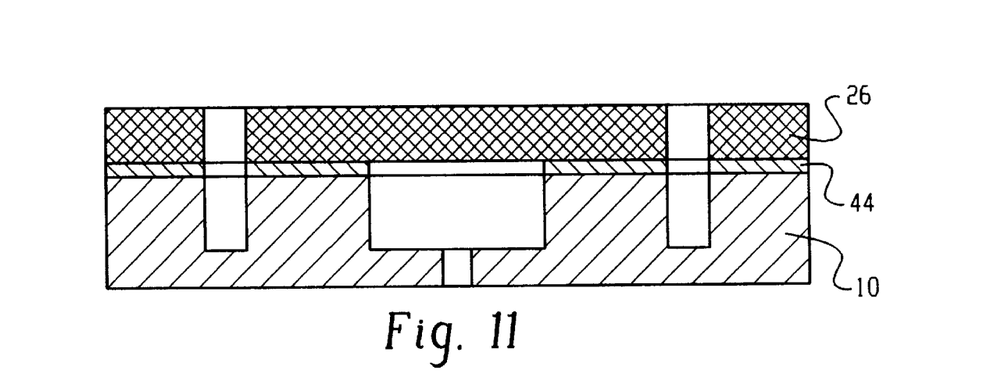
FIG. 11 is a cross-sectional view of the atomizer and inlet plate of FIG. 10 including a thin film layer, with the shading representing differing layers of crystal alignment or structure.

Once the composite or hybrid substrate is formed, any acceptable etching process may be used to form the features of the micromachined device, including dry etching or wet etching. As shown in FIG. 10, the composite or hybrid substrate of the present invention may be utilized in the form of an atomizer having an inlet plate 26. When using a composite substrate, the inlet plate 26 is arranged such that its crystal structure is misaligned with the crystal structure of the atomizer 10. In this manner, once the inlet plate 26 is bonded to the atomizer 10, the inlet plate-atomizer combination resists fracture propagation therethrough. When using a hybrid substrate, either the inlet plate 26 or the atomizer 10 is formed from polysilicon, and the other element is formed from single-crystal silicon. A thin film 44 may also be located between the atomizer 10 and the inlet plate 26, as illustrated in FIG. 11. It will be readily apparent to those skilled in the art that various arrangements of layers of misaligned crystal structures within a micromachined device structure can be utilized without departing from the scope of the invention. The layers may be similarly varied for the hybrid substrate. For example, differing layers formed of differing shapes and arranged at various angles may be used, and the selection and arrangement of materials, shapes, and layers may vary for different micromachined devices. The shape of the micromachined device, as well as the location and intensity of stresses it typically experiences will aid in selecting the varying shapes and parameters.

In yet another embodiment, the micromachined device may be formed by first etching a first set of elements on a first section, and then etching a second set of elements on a second section. The first and second section may then be joined together such that the crystal planes are misaligned, and such that the first and second elements are aligned so as to perform their specified functions. Continuing by way of example with the atomizer, this process may be implemented by etching a first set of elements including a spin chamber, an annulus, and several channels on a first layer of single crystal silicon. A second set of element, including a spin chamber, an annulus, several channels, and an orifice may then be etched on a second layer of single crystal silicon. The first layer and second layer are then aligned such that when the first layer abuts against the second layer, and the spin chambers, annuluses, and channels of the two layers are aligned. The first and second layers may then be bonded together to form the resultant atomizer having a misaligned crystal structure. The resultant structure appears the same as the atomizer shown in FIGS. 6–8.

Again, any number of misaligned layers or sections may be used to form micromachined devices utilizing this method. Furthermore, this same procedure may be used to form a hybrid micromachined device, wherein one of the sections is polysilicon and the other section is single-crystal silicon. Finally, the steps of the above-described methods may be used in combination; i.e., some components may be micromachined before bonding the misaligned or hybrid sections, and other components may be micromachined after the misaligned or hybrid sections are bonded together.

As shown in FIG. 12, micromachined devices formed by the methods of the present invention may be manufactured on a wafer 30 that includes a plurality of micromachined devices 10. For example, when forming an atomizer out of a polycrystalline silicon substrate, a polysilicon silicon substrate wafer may be provided and used as a substrate for a plurality of atomizers. Similarly, when forming micromachined devices of single crystal silicon having two or more misaligned layers, a substrate wafer 30 may be formed of two or more component wafers or wafer sections that are misaligned and bonded together. The substrate may then be used to form a plurality of micromachined devices 10, such as the atomizers illustrated in FIG. 12. Once the atomizers or micromachined devices are formed, the entire wafer may be shipped to a customer, or the micromachined devices may be removed from the wafer 30 and sold as an individual component.

The preferred form of the invention has been described above. However, with the present disclosure in mind it is believed that obvious alterations to the preferred embodiments, to achieve comparable features and advantages, will become apparent to those of ordinary skill in the art.

What is claimed is:

1. A method for forming a micromachined device comprising the steps of:

providing a bulk substrate of polycrystalline silicon; and bulk etching said bulk substrate to form the micromachined device.

2. The method of claim 1 wherein said bulk etching step includes using highly directional etching to form said micromachined device.

3. The method of claim 2 wherein said highly directional etching is deep reactive ion etching.

4. The method of claim 1 wherein said substrate has a thickness from between 100 to 1000 microns.

5. The method of claim 1 wherein said micromachined device is an atomizer, and wherein said etching step includes the steps of:
    etching a spin chamber in said substrate, said spin chamber being shaped to guide liquid in a vortex motion toward a center of said spin chamber;
    etching an annulus generally encircling said spin chamber in said substrate;
    etching at least one channel connecting said annulus to said spin chamber; and
    etching an orifice in said spin chamber.

6. The method of claim 5 wherein at least one of said etching steps is deep reactive ion etching.

7. The method of claim 5 wherein each of said etching steps is deep reactive ion etching.

8. The method of claim 7 wherein said spin chamber is generally circular in elevation and wherein said orifice is located at the center of said spin chamber.

9. The method of claim 8 wherein said at least channel extends generally chord-wise.

10. The method of claim 9 wherein said annulus is generally circular.

11. The method of claim 10 wherein said substrate has a top surface and a bottom surface, and wherein said orifice is etched through said bottom surface.

12. The method of claim 5 wherein said substrate has a thickness from between 100 to 1000 microns.

13. A method for forming a micromachined device comprising the steps of:
    providing a composite silicon bulk substrate, said substrate including a first section and a second section of single-crystal silicon joined together such the crystal plane structure of said first section is misaligned with the crystal plane structure of said second section; and
    etching said composite substrate to form said device.

14. The method of claim 13 wherein said first section and said second section are silicon fusion bonded.

15. The method of claim 13 wherein said substrate further includes a thin-film layer between said first section and said second section.

16. A method for forming an atomizer comprising the steps of:
    providing a composite silicon bulk substrate, said composite silicon substrate including a first layer and a second layer of single-crystal silicon joined together such the crystal plane of said first layer is misaligned with the crystal plane of said second layer;
    etching a spin chamber in said substrate, said spin chamber being shaped to guide liquid in a vortex motion toward a center of said spin chamber;
    etching an annulus generally encircling said spin chamber;
    a etching one or at least one channel connecting said annulus to said spin chamber; and
    etching an orifice in said spin chamber.

17. The method of claim 16 wherein said first layer and said second layer are silicon fusion bonded.

18. The method of claim 16 wherein said etching is deep reactive ion etching.

19. The method of claim 16 wherein said etching is anisotropic etching.

20. The method of claim 16 wherein said crystal planes are misaligned approximately 90 degrees.

21. The method of claim 16 further comprising the step of defining an etch mask pattern on both sides of said substrate before said spin chamber etching step.

22. The method of claim 16 wherein said substrate further includes a thin-film layer between said first layer and said second layer.

23. The method of claim 22 wherein said thin film layer is silicon dioxide.

24. The method of claim 16 wherein said first layer and said second layer each have a thickness of between about 200 and about 500 microns.

25. A method for forming a micromachined device for performing a specified function comprising the steps of:
    providing a first section of single crystal silicon having a first set of elements thereon;
    providing a second section of single crystal silicon having a second set of elements thereon; and joining said first and said second sections together such that said crystal planes of said first section and said second section are misaligned and such that said first set and said second set of elements are aligned so as to cooperate to perform said specified function.

26. The method of claim 25 wherein said first set of elements include a spin chamber shaped to guide liquid in a vortex motion toward a center of said spin chamber, an annulus generally encircling said spin chamber, a channel connecting said annulus to said spin chamber, and an orifice in said spin chamber, and wherein said second set of elements includes a trough shaped to deliver liquid to said annulus when said second section abuts against said first section.

27. The method of claim 26 wherein said first section and said second section are silicon fusion bonded.

28. A method for forming a micromachined device comprising the steps of:
    providing a composite silicon bulk material substrate, said substrate including a first section of polysilicon and a second section of single-crystal silicon joined together; and
    etching said composite substrate to form said device.

29. A composite silicon bulk material substrate for micromachined devices, the substrate comprising a first section of single-crystal silicon and a second section of single-crystal silicon joined together such the crystal plane structure of said first section is misaligned with the crystal plane structure of said second section.

30. A micromachined device for performing a specified function, the device including a first section of single crystal silicon and a second section of single crystal silicon joined together such that the crystal plane structure of said first section is misaligned with the crystal plane structure of said second section.

31. The micromachined device of claim 30 wherein said first section includes a spin chamber shaped to guide liquid in a vortex motion toward a center of said spin chamber, an annulus generally encircling said spin chamber, at least one channel connecting said annulus to said spin chamber, and an orifice in said spin chamber, and wherein said second section includes an inlet plate having a trough shaped to deliver liquid to said annulus.

32. The micromachined device of claim 30 wherein said first section includes a spin chamber, an annulus generally encircling said spin chamber, and at least one channel connecting said annulus to said spin chamber, and wherein said second section includes a spin chamber shaped to guide liquid in a vortex motion toward a center of said spin chamber, an annulus generally encircling said spin chamber, at least one channel connecting said annulus to said spin chamber, and an orifice in said spin chamber; wherein said first layer and said second sections are joined such that said spin chambers, said annuluses, and said channels are aligned.

33. An atomizer comprising:

first layer substrate having a spin chamber shaped to guide liquid in a vortex motion toward a center of said spin chamber, an annulus generally encircling said spin chamber, at least one channel connecting said annulus to said spin chamber, and an orifice in said spin chamber; and a second layer substrate joined to said first layer substrate, said second layer substrate having a trough shaped to deliver liquid to said annulus, wherein one of said first layer or said second layer is polycrystalline silicon, and wherein the other of said first layer or said second layer is single crystal silicon.

34. A composite silicon bulk material for use as a substrate for forming micromachined devices, the material comprising a first section of polysilicon and a second section of single-crystal silicon.

35. A method for forming a micromachined device, comprising the steps of:

providing a first wafer of single-crystal silicon;

providing a second wafer of single-crystal silicon;

joining said first and said second wafers to form a composite substrate, wherein the crystal planes of said first water and said second wafer are misaligned; and etching said micromachined device in said composite substrate.

* * * * *